(12) United States Patent
Hindi et al.

(10) Patent No.: US 6,818,694 B2
(45) Date of Patent: Nov. 16, 2004

(54) FILLER EXTENDED FIBERGLASS BINDER

(75) Inventors: Majid H. Hindi, Littleton, CO (US); Christopher P. Sandoval, Littleton, CO (US); Philip Francis Miele, Highlands Ranch, CO (US)

(73) Assignee: Johns Manville International, Inc.

( * ) Notice: Subject to any disclaimer, the term of this patent is extended or adjusted under 35 U.S.C. 154(b) by 37 days.

(21) Appl. No.: 10/268,594

(22) Filed: Oct. 10, 2002

(65) Prior Publication Data

US 2004/0069020 A1 Apr. 15, 2004

(51) Int. Cl.$^7$ .............................. C08K 7/14; C08K 3/34
(52) U.S. Cl. ........................................ 524/446; 524/447
(58) Field of Search .................................. 524/446, 447

(56) References Cited

U.S. PATENT DOCUMENTS

| | | | | |
|---|---|---|---|---|
| 5,123,949 A | * | 6/1992 | Thiessen | 65/450 |
| 5,318,990 A | * | 6/1994 | Strauss | 524/549 |
| 5,961,897 A | * | 10/1999 | Tonder et al. | 264/6 |
| 6,274,661 B1 | * | 8/2001 | Chen et al. | 524/388 |
| 6,299,936 B1 | * | 10/2001 | Reck et al. | 427/212 |
| 6,331,350 B1 | * | 12/2001 | Taylor et al. | 428/221 |
| 6,348,530 B1 | * | 2/2002 | Reck et al. | 524/244 |

FOREIGN PATENT DOCUMENTS

DE 19729161 A1 * 1/1999 ............ B27N/3/00

* cited by examiner

Primary Examiner—Matthew A. Thexton
(74) Attorney, Agent, or Firm—Robert D. Touslee

(57) ABSTRACT

Provided herewith is a fiberglass binder comprising an aqueous solution of a polycarboxy polymer, a polyol and at least 30 weight percent of a filler material, preferably clay. The clay filler material is generally present in the aqueous solution as a suspension of particles having an average size of 3 μm or less. The clay filler extended fiberglass binder of the present invention is more cost effective without significantly altering the appearance or function of the binder.

15 Claims, No Drawings

FILLER EXTENDED FIBERGLASS BINDER

BACKGROUND OF THE INVENTION

1. Field of the Invention

The present invention relates to the production of fibrous products. More particularly, the present invention relates to the production of fiberglass products which incorporate a filler, preferably a clay filler.

2. Description of the Related Art

Fiberglass products are commonly produced by melting the glass and then fiberizing the molten liquid. Primary fibers so produced are attenuated into smaller diameter fibers of finite length which typically are deposited onto a moving support or collection surface to form a mass or layer of uniformly distributed, intertwined fibers. Liquid binder is sprayed on the fibers as they move toward the support. The mass or layer of fibers is subsequently transported into an oven in which the binder is set or cured.

The properties of the fibrous products produced in this manner are based upon the properties of the glass fibers, and the compositions of the glasses themselves. It would at times be beneficial to modify the products in order to enhance certain properties and/or reduce costs. A major problem encountered in introducing additive materials or extenders is the difficulty in uniformly distributing them throughout the fibrous matrix. If liquid additives are not sticky, they may be difficult to adhere to the fibers when sprayed onto the fibers as they move toward the collection surface. If liquid additives are sprayed onto an already formed fibrous mass, it is difficult to uniformly disperse them throughout the mass. It is even more difficult to add solid additives to a layer or a mass of collected fibers so as to uniformly penetrate and become dispersed throughout the mass. Indeed, if the particular additive or extender desired is available only in solid form, the present state of the art of introducing it to the fibrous product dictates against such addition.

U.S. Pat. No. 5,123,949 discloses a particular method of adding solid additives to a fiber product. A heat curable liquid binder is sprayed at the same time as the particle additives onto the moving fibers, from a point inside the fiber veil. The specific extenders noted as useful include volcanic ash, expanded perlite, or vermiculite. The size of the extender particles generally ranges from one-eighth to one-quarter inch. Such extenders may typically be present in the product up to 70% by weight, with 40% being a commercially practical maximum amount, as disclosed in the patent.

The addition of fillers or extenders, as well as other additives to the binder solution, is known in the art. For example, see U.S. Pat. No. 5,661,213, which lists many different types of additives for a curable aqueous composition used as a binder, including fillers. The use of large amounts of fillers or extenders in binder solutions, if the filler or extender were to not interfere with the appearance or function of the binder, would enable the use of binders in a more cost effective manner. While the concept of adding fillers to a binder solution has been suggested, particular fillers and their amounts, and/or particular effective methods of adding the filler to the binder solution have not heretofore been contemplated. If such fillers or extenders also enhanced certain properties of the fiberglass product, not only would the economics of its use be desirable, but product advantages would also be realized. The use of such fillers or extenders in conjunction with binder compositions would be greatly desirable.

Accordingly, an objective of the present invention is to provide an extended binder system for fiberglass which enables the use of the binder in a more cost effective manner, and also avoids substantial problems in the application of the binder containing the filler or extender.

Yet another object of the present invention is to provide an extended binder which also enhances the physical characteristics of the fiberglass product.

These and other objects of the present invention will become apparent to the skilled artisan upon a reading of the following specification and the claims appended hereto.

SUMMARY OF THE INVENTION

In accordance with the foregoing objectives, the present invention provides one with a fiberglass binder comprising an aqueous solution of a polycarboxy polymer, a polyol and at least 30 weight percent of a filler material, preferably a clay filler material. The clay filler preferably comprises bentonite or kaolin. The filler material is suspended in the fiberglass binder aqueous solution, with the average size of the filler material particles being about 3 $\mu$m or less. Such a stable suspension is important to the success of extending the binder.

Among other factors, the present invention is based upon the discovery that the use of a filler material such as clay can be stably suspended in a binder aqueous solution comprised of a polycarboxy polymer and a polyol, in amounts of at least 30 weight percent, thereby enabling a more cost effective use of the fiberglass binder. The filler material is suspended in the solution by employing particles having an average size of about 3 $\mu$m or less, thereby leading to a stable suspension. Application of the binder using conventional methods is therefore appropriate. The final product has also been found to exhibit enhanced toughness, and thus better performance, upon suspending the filler, especially clay, in the binder solution.

DETAILED DESCRIPTION OF THE PREFERRED EMBODIMENTS

Fillers and extenders for fiberglass products have been known. Problems with their incorporation into the product, however, have often been difficult, requiring the use of special application techniques. The present invention, however, has found that incorporating a filler into a binder solution as a stable suspension can provide a more economic binder, as well as enhance the binding effectiveness and the ultimate properties of the final product. The presence of the filler in accordance with the present invention actually seems to provide a stronger binder, particularly the clay filler. Employing a suspension of the filler also results in the binder being better dispersed, more uniformly.

The present invention provides one with the opportunity to extend a fiberglass binder solution, thereby making its use more cost effective and economic. As well, the final product is surprisingly found to have enhanced performance characteristics with regard to the toughness of the fiberglass fibers. The final fiberglass product is less brittle as compared to products employed using a binder without the filler.

The fiberglass binder of the present invention comprises an aqueous solution of a polycarboxy polymer, a polyol and at least 30 weight percent of a filler material, preferably clay. The fiberglass binder solution can contain at least 35 weight percent and upwards of 40 weight percent and more of the filler material with good results, for example, from 30–50 weight percent or more. The most preferred filler material is that of clay, and specifically bentonite or kaolin. Other filler materials such as talc, vermiculite, expanded perlite and volcanic ash can be used, as long as they can form a stable suspension of particles in the binder solution.

The filler material is mixed in with the fiberglass binder solution to form a suspension of the filler material in the binder solution. The fiberglass binder solution to which the filler material is added, and in which it is suspended, also comprises a polycarboxy polymer and a polyol. A stable suspension has been found to be obtained when the filler material has an average size of about 3 µm or less, more preferably about 2 µm or less, and most preferably about 1 µm or less. The use of such small particle sizes allows the suspension to maintain its stability for times ranging from days to several hours depending on the initial concentration of solids in the binder system. In production, such suspension times are believed to be adequate for transportation of the binder and the spraying of the binder onto the glass fibers prior to curing.

The use of such a suspended filler material has been found to avoid any substantial effect on the thermoset behavior of the filled binder compared to unfilled. Thus, the binder can be cured as efficiently and effectively in the oven while achieving the economic and performance benefits realized by the presence of the filler. The cost benefits are achieved due to the binder solution being extended. The performance advantages are achieved in that the final fiberglass product shows additional toughness, and is less brittle than products prepared using a binder that does not contain the filler material of the present invention.

It is also preferred that the fillers employed in the present invention are sufficiently white to maintain acceptable whiteness of the binder after cure. Such binders include bentonite and kaolin. Titanium dioxide may be added in small quantities to the fiberglass binder to increase whiteness, if desired.

The polycarboxy polymer used in the binder of the present invention comprises an organic polymer or oligomer containing more than one pendant carboxy group. The polycarboxy polymer may be a homopolymer or copolymer prepared from unsaturated carboxylic acids including but not necessarily limited to, acrylic acid, methacrylic acid, crotonic acid, isocrotonic acid, maleic acid, cinnamic acid, 2-methylmaleic acid, itaconic acid, 2-methylitaeonic acid, alpha, beta-methyleneglutaric acid, and the like. Alternative, the polycarboxy polymer may be prepared from unsaturated anhydrides including, but not necessarily limited to, maleic anhydride, methacrylic anhydride, and the like, as well as mixtures thereof. Methods for polymerizing these acids and anhydrides are well-known in the chemical art.

The polycarboxy polymer of the present invention may additionally comprise a copolymer of one or more of the aforementioned unsaturated carboxylic acids or anhydrides and one or more vinyl compounds including, but not necessarily limited to, styrene, alpha-methylstyrene, aorylonitrile, methacrylonitrile, methyl acrylate, ethyl acrylate, n-butyl acrylate, isobutyl acrylate, methyl methacrylate, n-butyl methacrylate, isobutyl methacrylate, blycidyl methacrylate, vinyl methyl ether, vinyl acetate, and the like. Methods for preparing these copolymers are well-known in the art.

Preferred polycarboxy polymers comprise homopolymers and copolymers of polyacrylic acid. It is particularly preferred that the molecular weight of the polycarboxy polymer, and in particular polyacrylic acid polymer, is less than 10000, more preferably less than 5000, and most preferably about 3000 or less. The low molecular weight polycarboxy polymer, when combined with a low pH binder, results in a final product which exhibits excellent recovery and rigidity.

The formaldehyde-free curable aqueous binder composition of the present invention also contains a polyol containing at least two hydroxyl groups. The polyol must be sufficiently nonvolatile such that it will substantially remain available for reaction with the polyacid in the composition during heating and curing operations. The polyol may be a compound with a molecular weight less than about 1000 bearing at least two hydroxyl groups such as, for example, ethylene glycol, glycerol, pentaerythritol, trimethylol propane, sorbitol, sucrose, glucose, resorcinol, catechol, pyrogallol, glycollated ureas, 1,4-cyclohexane diol, diethanolamine, triethanolamine, and certain reactive polyols such as, for example, beta-hydroxyalkylamides such as, for example, bis[N,N-di(beta-hydroxyethyl)]adipamide, as may be prepared according to the teachings of U.S. Pat. No. 4,076,917, hereby incorporated herein by reference, or it may be an addition polymer containing at least two hydroxyl groups such as, for example, polyvinyl alcohol, partially hydrolyzed polyvinyl acetate, and homopolymers or copolymers of hydroxyethyl (meth) acrylate, hydroxypropyl(meth) acrylate, and the like. The most preferred polyol for the purposes of the present invention is triethanolamine (TEA).

The ratio of the number of equivalents of carboxy, anhydride, or salts thereof of the polyacid to the number of equivalents of hydroxyl in the polyol is from about 1/0.01 to about 1/3. An excess of equivalents of carboxy, anhydride, or salts thereof of the polyacid to the equivalents of hydroxyl in the polyol is preferred. The more preferred ratio of the number of equivalents of carboxy, anhydride, or salts thereof in the polyacid to the number of equivalents of hydroxyl in the polyol is from about 1/0.4 to about 1/1. The most preferred ratio of the number of equivalents of carboxy, anhydride, or salts thereof in the polyacid to the number of equivalents of hydroxyl in the polyol is from about 1/0.2 to about 1/0.95, more preferably from 1/0.6 to 1/0.8, and most preferably from 1/0.65 to 1/0.75. A low ratio, approaching 1/0.7 has been found to be of particular advantage in the present invention, when combined with a low molecular weight polycarboxy polymer, and also preferably with a low pH binder.

It is preferred that the formaldehyde-free curable aqueous binder composition of the present invention also contain a catalyst. Most preferably, the catalyst is a phosphorous-containing accelerator which may be a compound with a molecular weight less than about 1000 such as, for example, an alkali metal polyphosphate, an alkali metal dihydrogen phosphate, a polyphosphoric acid, and an alkyl phosphinic acid or it may be an oligomer or polymer bearing phosphorous-containing groups such as, for example, addition polymers of acrylic and/or maleic acids formed in the presence of sodium hypophosphite, addition polymers prepared from ethylenically unsaturated monomers in the presence of phosphorous salt chain transfer agents or terminators, and addition polymers containing acid-functional monomer residues such as, for example, copolymerized phosphoethyl methacrylate, and like phosphonic acid esters, and copolymerized vinyl sulfonic acid monomers, and their salts. The phosphorous-containing accelerator may be used at a level of from about 1% to about 40%, by weight based on the combined weight of the polyacid and the polyol. Preferred is a level of phosphorous-containing accelerator of from about 2.5% to about 10%, by weight based on the combined weight of the polyacid and the polyol.

It is most preferred that the pH of the binder of the present invention also be low, i.e., no greater than 4.5. For it has been found that the combination of low molecular weight polycarboxy polymer with a lowered pH provides a binder exhibiting minimal processing difficulties and a final product with excellent recovery and rigidity. Maintaining the pH in the range of greater than 3.5 to 4.5 or less, also allows one to avoid serious problems with corrosion of the equipment while still realizing the benefits of the low pH.

The formaldehyde-free curable aqueous binder composition may be prepared by admixing the polyacid, the polyol, and the phosphorous-containing accelerator using conventional mixing techniques. In another embodiment, a carboxyl- or anhydride-containing addition polymer and a polyol may be present in the same addition polymer, which addition polymer would contain both carboxyl, anhydride, or salts thereof functionality and hydroxyl functionality. In another embodiment, the salts of the carboxy-group are salts of functional alkanolamines with at least two hydroxyl groups such as, for example, diethanolamine, triethanolamine, dipropanolamine, and di-isopropanolamine. In an additional embodiment, the polyol and the phosphorous-containing accelerator may be present in the same addition polymer, which addition polymer may be mixed with a polyacid. In yet another embodiment the carboxyl- or anhydride-containing addition polymer, the polyol, and the phosphorous-containing accelerator may be present in the same addition polymer. Other embodiments will be apparent to one skilled in the art. As disclosed herein-above, the carboxyl groups of the polyacid may be neutralized to an extent of less than about 35% with a fixed base before, during, or after the mixing to provide the aqueous composition. Neutralization may be partially effected during the formation of the polyacid.

Once the composition of the polyacid and the polyol has been prepared, the filler in fine particulate form can then be mixed in with the composition to form the final composition to be sprayed on the fiberglass. As molten streams of glass are drawn into fibers of random lengths and blown into a forming chamber where they are randomly deposited as a mat onto a traveling conveyor, the fibers, while in transit in the forming chamber, are simply sprayed, as is conventional, with the filler extended aqueous binder composition of the present invention. While being drawn, the molten glass fibers generally form a veil. The binder of the present invention can be effectively sprayed from a point inside or outside the fiber veil.

More particularly, in the preparation of fiberglass insulation products, the products can be prepared using conventional techniques. As is well known, a porous mat of fibrous glass can be produced by fiberizing molten glass and immediately forming a fibrous glass mat on a moving conveyor. The expanded mat is then conveyed to and through a curing oven wherein heated air is passed through the mat to cure the resin. The mat is slightly compressed to give the finished product a predetermined thickness and surface finish. Typically, the curing oven is operated at a temperature from about 150° C. to about 325° C. Preferably, the temperature ranges from about 180° E to about 225° C. Generally, the mat resides within the oven for a period of time from about ½ minute to about 3 minutes. For the manufacture of conventional thermal or acoustical insulation products, the time ranges from about ¾ minute to about 1½ minutes. The fibrous glass having a cured, rigid binder matrix emerges from the oven in the form of a bat which may be compressed for packaging and shipping and which will thereafter substantially recover its vertical dimension when unconstrained.

The formaldehyde-free curable aqueous composition may also be applied to an already formed nonwoven by conventional techniques such as, for example, air or airless spraying, padding, saturating, roll coating, curtain coating, beater deposition, coagulation, or the like.

The waterborne formaldehyde-free composition, after it is applied to a nonwoven, is heated to effect drying and curing. The duration and temperature of heating will affect the rate of drying, processability and handleability, and property development of the treated substrate. Heat treatment at about 120° C., to about 400° C., for a period of time between about 3 seconds to about 15 minutes may be carried out; treatment at about 150° C., to about 250° C., is preferred. The drying and curing functions may be effected in two or more distinct steps, if desired. For example, the composition may be first heated at a temperature and for a time sufficient to substantially dry but not to substantially cure the composition and then heated for a second time at a higher temperature and/or for a longer period of time to effect curing. Such a procedure, referred to as "B-staging", may be used to provide binder-treated nonwoven, for example, in roll form, which may at a later stage be cured, with or without forming or molding into a particular configuration, concurrent with the curing process.

The final fiberglass products may be used for applications such as, for example, insulation batts or rolls, as reinforcing mat for roofing or flooring applications, as roving, as microglass-based substrate for printed circuit boards or battery separators, as filter stock, as tape stock, as tape board for office petitions, in duct liners or duct board, and as reinforcement scrim in cementitious and non-cementitious coatings for masonry.

The present invention thereby provides one with a novel binder composition which is a suspension of the filler particles in an aqueous solution of a polycarboxy polymer and a polyol. The suspension allows for a more economic use of a binder solution, while not interfering in the binding activity or curing of the binder. Furthermore, the filler presence has been found to improve the performance characteristics of the final product, in that the final product is generally less brittle as compared to the use of an unfilled binder.

While the invention has been described with preferred embodiments, it is to be understood that variations and modifications may be resorted to as will be apparent to those skilled in the art. Such variations and modifications are to be considered within the purview and the scope of the claims appended hereto.

What is claimed is:

1. A fiberglass binder, comprising an aqueous solution of a polycarboxy polymer, a polyol, and at least 30 wt. % of a filler material, with the filler material being suspended in the aqueous solution, and with the average particle size of the filler material being 3 microns or less.

2. The fiberglass binder of claim 1, wherein the polycarboxy polymer comprises a homopolymer or copolymer of polyacrylic acid.

3. The fiberglass binder of claim 1, wherein the amount of filler material in the fiberglass binder is at least 35% by weight.

4. The fiberglass binder of claim 1, wherein the amount of filler material in the fiberglass binder is at least 40% by weight.

5. The fiberglass binder of claim 1, wherein the filler material is comprised of clay.

6. The fiberglass binder of claim 5, wherein the clay filler comprises bentonite.

7. The fiberglass binder of claim 5, wherein the clay filler comprises kaolin.

8. The fiberglass binder of claim 1, wherein the polyol is triethanolamine.

9. The fiberglass binder of claim 1, wherein the binder further comprises a phosphorus based catalyst.

10. The fiberglass binder of claim 1, wherein the filler material suspended in solution is of an average size of 1 μm or less.

11. The fiberglass binder of claim 1, wherein the solution has a pH ranging from 3.5 to 4.5.

12. A fiberglass product, comprised of the binder of claim 1.

13. The fiberglass product of claim 12, wherein the product is insulation.

14. A fiberglass product, comprised of the binder of claim 2.

15. The fiberglass product of claim 14, wherein the product is insulation.

* * * * *